United States Patent [19]

Marcellus

[11] Patent Number: 4,967,166

[45] Date of Patent: Oct. 30, 1990

[54] CRYSTAL OSCILLATOR AND METHOD FOR MOUNTING THE SAME

[75] Inventor: Emerson C. Marcellus, Pasadena, Tex.

[73] Assignee: Schlumberger Technology Corporation, Houston, Tex.

[21] Appl. No.: 447,304

[22] Filed: Dec. 7, 1989

[51] Int. Cl.$^5$ .................... H01L 41/08; H03B 5/36
[52] U.S. Cl. ................... 331/116 R; 310/348; 331/158; 361/417
[58] Field of Search ............. 331/116 R, 116 FE, 158; 310/348, 349, 351, 353, 355, 356; 361/417, 418

[56] References Cited

U.S. PATENT DOCUMENTS

| | | | |
|---|---|---|---|
| 4,398,117 | 8/1983 | St. Cyr | 310/348 |
| 4,574,331 | 3/1986 | Smolley | 361/393 |
| 4,581,679 | 4/1986 | Smolley | 361/395 |
| 4,703,218 | 10/1987 | Takahashi et al. | 310/348 |
| 4,733,172 | 3/1988 | Smolley | 324/158 P |

OTHER PUBLICATIONS

"Button Board: The Short-cut connector" by Robert G. Davison, in Quest, Winter 1985/1986, pages 54-61.

Primary Examiner—Siegfried H. Grimm
Attorney, Agent, or Firm—Henry N. Garrana; Frederic C. Wagret

[57] ABSTRACT

A crystal oscillator including a crystal element designed to oscillate at a given frequency when subjected to an exciting voltage, and mounted parallel to and on a base through at least a wad made of at least a thin wound wire. Advantageously, the wire is randomly wound and is electrically conductive. The wad is elongated and is disposed parallel to said crystal and to said base.

20 Claims, 1 Drawing Sheet

CRYSTAL OSCILLATOR AND METHOD FOR MOUNTING THE SAME

BACKGROUND OF THE INVENTION

1. Field of the Invention

This invention relates generally to crystal oscillators, and especially to oscillators able to work under adverse environmental conditions, such as high temperature, shocks and/or vibrations.

2. Description of the Related Art

Crystal oscillators are commonly used as time measurement or time base devices. Crystal oscillators usually include a plane element made e.g. of a piezoelectric crystal, and able, when subjected to an exciting voltage, to oscillate at a given frequency. The resulting oscillating signal may be used for any signal processing or measurement related to time. The reliability of such measurement depends on the stability of the oscillator, which is greatly influenced by environmental conditions, such as temperature and mechanical stress (vibrations and shocks). The crystal element is usually fixed parallel to and on a base so that it may freely oscillate, while being electrically connected to the other electronic components of the oscillator. Shocks and/or vibrations may damage or break the connection between the crystal and the base, or break the crystal itself. Extreme temperature or rapid temperature changes, besides any drift of the oscillating frequency, may have the same consequences due to differential thermal expansion between the oscillating element and the base.

The connection between the oscillating crystal element and the base of the oscillator is thus critical.

Among the numerous technical areas where crystal oscillators are used, are well logging techniques and measurement while drilling techniques (hereafter referred to as MWD), wherein a tool is lowered in a well to carry out physical measurements from which are derived information related to earth formations surrounding the well and downhole drilling conditions. The problem of stability hereabove referred to is all the more of concern in the logging and MWD techniques since the environmental conditions are particularly severe in a well.

Known crystal oscillators are usually built in such a way that the crystal is rigidly mounted on the base, by glue for instance. The rigid-type connection enhances the risks of excessive performance changes and possible breakage of the crystal due to its brittleness, since shocks, vibrations and thermal differential expansion stress are thus integrally transmitted to the crystal.

It has been attempted, in a known manner, to obviate these difficulties by mounting the crystal on a base through flexible legs. However, this implementation has not been proving satisfactory since it increases the overall dimensions and manufacturing costs of the oscillator. The flexible legs allow the crystal to move too freely which leads to breakage of the crystal in the high shock and vibration environment of well logging and MWD.

Accordingly, there is a need for a crystal oscillator able to withstand shocks and vibrations as well as temperature changes.

SUMMARY OF THE INVENTION

A general object of the invention is to provide a crystal oscillator being shock and vibration resistant, while being able to allow differential temperature expansion between the crystal and the base.

The foregoing and other objects are attained in accordance with the invention by a crystal oscillator including a crystal element designed to oscillate at a given frequency when subjected to an exciting voltage, and mounted on a base through connecting means, wherein said connecting means includes at least a wad made of at least one turn of at least one thin wound wire.

Preferably, said wire is randomly wound and is electrically conductive.

In addition, the wad is elongated and has a longitudinal axis; e.g. the wad is cylinder-shaped or parallelepiped-shaped.

In a preferred embodiment, the elongated wad is mounted with its longitudinal axis parallel to the base and the crystal.

Advantageously, said connecting means further includes an adhesive that is preferably electrically conductive.

As an example, the crystal element is in the form of a disc of 0.27 inch (0.68 centimeter) diameter. In a preferred embodiment, the wad is 0.045 inch (0.12 centimeter) long (parallel to said crystal) and has a diameter (transversely to said crystal) ranging from 0.01 to 0.05 inch (between 0.25 and 0.127 millimeter), and the wire has a diameter ranging from 0.001 to 0.005 inch (between 0.025 and 0.0127 millimeter).

DESCRIPTION OF THE PREFERRED EMBODIMENTS

As mentioned, the present invention affords an improved crystal oscillator, which by way of example, has particular utility in well logging and/or MWD applications, and a representative embodiment of the invention is described and illustrated herein in that environment. It will be understood, however, that this is merely illustrative of but one of the various applications for which the invention is suitable.

Figure 1:
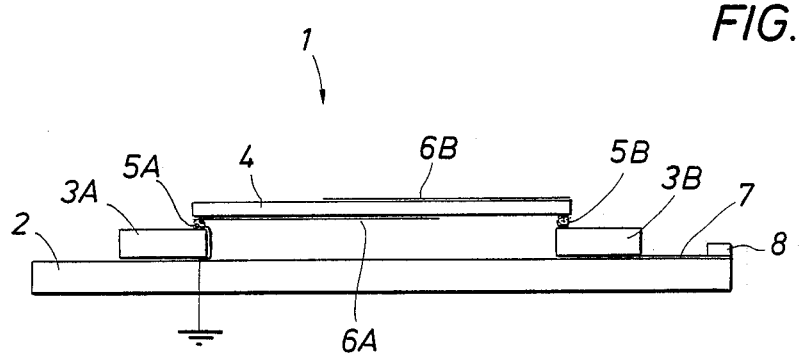
FIG. 1 is a diagrammatic side view of a crystal as used in an oscillator according to the invention.

FIG. 1 illustrates a crystal oscillator 1, including a parallelepiped shaped base 2 made of insulating material, e.g. of ceramic, and a first and a second pad 3A and 3B fixed on one face (in this case the top face) of said base 2 at a given distance one from another. A crystal plate 4, e.g. disc shaped, is disposed close to and parallel to said base 2, on top of said pads 3A and 3B, through connecting means 5A, 5B to be described in further detail. Crystal plate 4 rests by its edge on said pads 3A, 3B. Plane and elongated electrodes 6A, 6B are disposed parallel to the crystal 4, one on each side of the latter. The electrodes 6A, 6B are fixed by one of their ends to the edge of crystal 4 by a conductive adhesive. As an alternative, the crystal 4, along with the associated electrodes 6A and 6B, may be fixed directly on the base 2 by e.g. a conductive adhesive, thus without the pads 3A, 3B.

Figure 3:
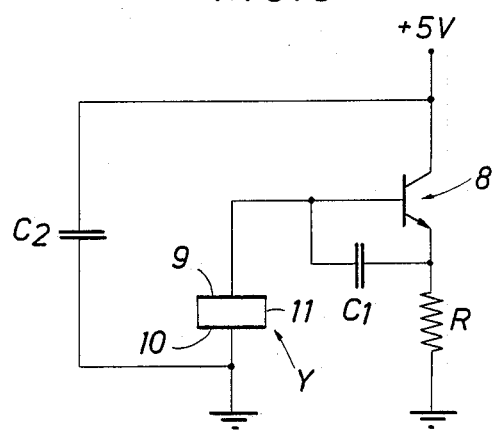
FIG. 3 is an electronic circuit equivalent to the oscillator of FIG. 1.

The crystal plate 4 is made of piezoelectric material and is able to vibrate at a given frequency when subjected to an exciting voltage in a tuned circuit, such as the one shown in FIG. 3 and further detailed. Pads 3A and 3B are, in the embodiment represented in the drawing, part of the electrical circuit of the oscillator. First pad 3A is connected to ground, and an electrical connector 7 is provided between second pad 3B and a transistor 8 disposed on said base 2. On the top face of base 2 are placed electronic components (not shown) which are part of the circuitry (known per se) of the oscillator.

FIG. 3 shows an electrical circuit equivalent to the oscillator shown in FIG. 1, and including a power source (not shown and known per se) which supplies voltage (such as +5V) to the collector of a transistor 8 the emitter of which is connected to ground via a resistor R. The base of transistor 8 is linked to ground through a crystal Y. A capacitor C1 shunts the transistor base and the transistor emitter. Crystal Y includes facing electrodes 9 and 10, corresponding to first and second electrodes 6A and 6B, and separated by a space 11 where is disposed a piezoelectrical plate corresponding to plate 4 of FIG. 1. A capacitor C2 shunts the power source to ground. The pads 3A and 3B correspond to and act as respectively the capacitor C1 and the capacitor C2.

The function of the connecting means 5A and 5B is to mechanically fix as well as electrically connect the piezoelectric crystal 4 to the pads 3A and 3B, themselves fixed on the base 2.

Figure 2:
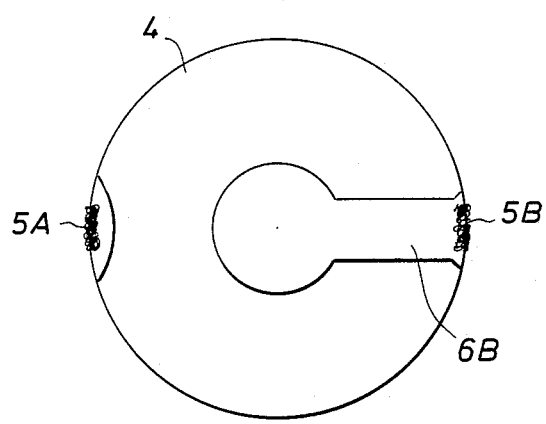
FIG. 2 is a top view of the crystal plate and the electrodes.
Figure 4:
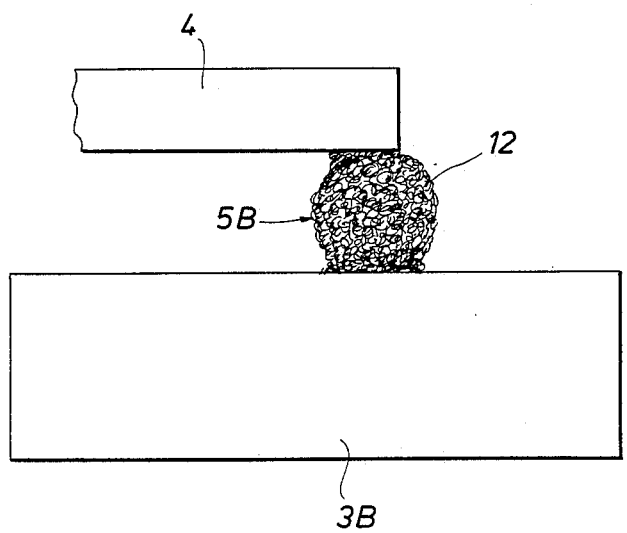
FIG. 4 is an enlarged side view showing in detail the connecting means between the crystal and the base.
Figure 5:
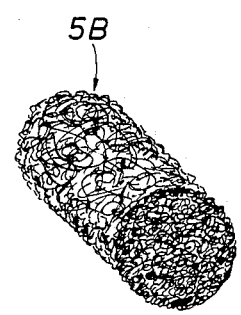
FIG. 5 is a perspective view of connecting means according to the invention in the form of a wad of a randomly wound wire.

Referring to FIG. 4 and 5, the connecting means 5A and 5B are made each, in a preferred embodiment, of a thin metallic wire, or a set of metallic wires, e.g. randomly wound, and forming a wad of substantially cylindrical shape. The wad may be, alternatively, regularly wound, such as in circles. Also, the wad may be parallelepiped-shaped. Preferably, the elongated wad is placed with its longitudinal axis parallel to the crystal plate 4 (see FIG. 2).

Each wad is advantageously glued to the corresponding electrode 6A, 6B and crystal 4 as well as to the corresponding pad (3A or 3B) by an organic electrically conductive adhesive 12, in the form of a film, such as the adhesive sold under the name Abelband 71-1 by Abelstick Inc. As an alternative, the adhesive is a metallic adhesive made of or including solder.

By way of example, said wire has a 0.002 inch diameter (0.051 millimeter), and the wad is 0.045 inch long (0.12 centimeter) and has a diameter of 0.03 inch (0.8 millimeter). Such a wad may be obtained from the firm Cinch Connector, Elk Grove Village, Ill. 60007.

The connecting means according to the invention are relatively stiff and maintain firmly the crystal, thus allowing it to resist shocks and vibrations. At the same time, the connecting means are able to give slightly upon stress of force due to differential thermal expansion owing to the different thermal coefficients of expansion of the crystal plate and the structure of the oscillator on which is fixed the crystal plate.

The wads 5A, 5B are preferably disposed regularly along the periphery of the crystal plate 4. In the illustrated embodiment, the two wads are disposed along a diameter of said disc shaped crystal plate. In another embodiment, three or more wads may be provided and regularly disposed along the perimeter of the crystal plate.

Although the invention has been described and illustrated with reference to a specific embodiment thereof, it will be understood by those skilled in the art that various modifications and variations of that embodiment may be made without departing from the invention concepts disclosed. Accordingly, all such modifications are intended to be included within the spirit and scope of the appended claims.

What is claimed is:

1. A crystal oscillator including a crystal element designed to oscillate at a given frequency when subjected to an exciting voltage, and mounted on a base through connecting means, wherein said connecting means includes at least a wad made of at least one turn of at least one thin wound wire.

2. The oscillator according to claim 1 wherein said wire is randomly wound.

3. The oscillator according to claim 1 wherein said wire is electrically conductive.

4. The oscillator according to claim 1, wherein said wad is of substantially elongated shape and presents a longitudinal axis.

5. The oscillator according to claim 4 wherein said wad is substantially cylinder-shaped.

6. The oscillator according to claim 4 wherein said crystal element and said base are substantially plane and mounted parallel, and wherein said elongated wad is mounted with its longitudinal axis parallel to said base and said crystal element.

7. The oscillator according to claim 1, wherein said connecting means further includes adhesive means.

8. The oscillator according to claim 7 wherein said adhesive means is electrically conductive.

9. The oscillator according to claim 4, wherein the length of said wad is comprised between 0.04 inch and 1.0 inch and has a diameter comprised between 0.01 and 0.05 inch.

10. The oscillator according to claim 1 wherein said wire has a diameter comprised between 0.001 and 0.005 inch.

11. The oscillator according to claim 8 wherein said adhesive means includes solder.

12. The oscillator according to claim 1 wherein said connecting means includes two or more wads regularly disposed along the periphery of said crystal element.

13. A method for manufacturing a crystal oscillator including a crystal element designed to oscillate at a given frequency when subjected to an exciting voltage, comprising the step of mounting said crystal element on a base through connecting means including at least a wad made of at least one turn of at least one thin wound wire.

14. The method according to claim 13 wherein said wire is randomly wound.

15. The method according to claim 13 wherein said wire is electrically conductive.

16. The method according to claim 13 wherein said crystal is disc shaped and wherein said connecting means includes two wads disposed at the periphery of said crystal disc, along a diameter of said disc.

17. A tool for determining characteristics of earth formations surrounding a borehole, comprising means for measuring physical parameters of said formations, said measuring means comprising a crystal oscillator including a crystal element designed to oscillate at a given frequency when subjected to an exciting voltage, and mounted on a base through connecting means, wherein said connecting means includes at least a wad made of at least a thin wound wire.

18. The tool according to claim 17 wherein said wire is randomly wound.

19. The tool according to claim 17 wherein said wire is electrically conductive.

20. The tool according to claim 17 wherein said connecting means further includes adhesive means.

* * * * *